United States Patent
Min et al.

(10) Patent No.: US 10,332,779 B2
(45) Date of Patent: Jun. 25, 2019

(54) METHOD OF FABRICATING A SEMICONDUCTOR DEVICE

(71) Applicant: Samsung Electronics Co., Ltd., Suwon-si, Gyeonggi-do (KR)

(72) Inventors: Kyungseok Min, Yongin-si (KR); Moojin Kim, Suwon-si (KR); Seongjin Nam, Seongnam-si (KR); Sughyun Sung, Yongin-si (KR); YoungHoon Song, Suwon-si (KR); Youngmook Oh, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/342,456

(22) Filed: Nov. 3, 2016

(65) Prior Publication Data

US 2017/0133263 A1    May 11, 2017

(30) Foreign Application Priority Data

Nov. 9, 2015    (KR) .................. 10-2015-0156937

(51) Int. Cl.
*H01L 21/02*    (2006.01)
*H01L 21/762*    (2006.01)
(Continued)

(52) U.S. Cl.
CPC .. *H01L 21/76224* (2013.01); *H01L 21/02118* (2013.01); *H01L 21/3065* (2013.01);
(Continued)

(58) Field of Classification Search
CPC ............. H01L 27/10879; H01L 29/785; H01L 27/1211; H01L 27/0924
See application file for complete search history.

(56) References Cited

U.S. PATENT DOCUMENTS 7,329,580 B2    2/2008  Choi et al.
7,494,933 B2    2/2009  Liu
(Continued)

FOREIGN PATENT DOCUMENTS

KR    101380835 B1    4/2014
KR    101465338 B1    11/2014
KR    101466487 B1    12/2014

OTHER PUBLICATIONS

Raja, L., et al., "Computational modeling study of the radial line slot antenna microwave plasma source with comparisons to experiments," Journal of Vacuum Science & Technology A, vol. 31, 2013, pp. 031304-1-031304-11.
(Continued)

*Primary Examiner* — Mohammad M Choudhry
(74) *Attorney, Agent, or Firm* — Harness, Dickey & Pierce, P.L.C.

(57) ABSTRACT

A method of fabricating a semiconductor device may include forming trenches in a substrate to define a fin structure extending in a direction, forming a device isolation layer to fill the trenches, and removing an upper portion of the device isolation layer to expose an upper side surface of the fin structure. The exposing of the upper side surface of the fin structure may include repeatedly performing an etching cycle including a first step and a second step, and an etching rate of the device isolation layer to the fin structure may be higher in the second step than in the first step.

14 Claims, 8 Drawing Sheets

(51) Int. Cl.
*H01L 27/108* (2006.01)
*H01L 21/3065* (2006.01)
*H01L 21/311* (2006.01)

(52) U.S. Cl.
CPC .. *H01L 21/31116* (2013.01); *H01L 27/10879* (2013.01); *H01J 2237/3347* (2013.01)

(56) References Cited

U.S. PATENT DOCUMENTS

| | | | |
|---|---|---|---|
| 8,692,316 | B2 | 4/2014 | Xie |
| 8,927,353 | B2 | 1/2015 | Hsu et al. |
| 9,105,585 | B2 | 8/2015 | Matsuoka et al. |
| 9,245,752 | B2 | 1/2016 | Yeom et al. |
| 9,825,173 | B2* | 11/2017 | Lin ................. H01L 29/785 |
| 2006/0118876 | A1* | 6/2006 | Lee ................. H01L 29/66795 257/365 |
| 2008/0009135 | A1* | 1/2008 | Ema ................. H01L 21/76897 438/692 |
| 2011/0097889 | A1 | 4/2011 | Yuan et al. |
| 2011/0260282 | A1 | 10/2011 | Kawasaki |
| 2012/0032267 | A1 | 2/2012 | Cheng et al. |
| 2014/0252483 | A1 | 9/2014 | Nagumo |
| 2016/0104627 | A1* | 4/2016 | Li ................. H01L 21/3081 257/288 |

OTHER PUBLICATIONS

Tian, C., et al., "Characteristics of large-diameter plasma using a radial-line slot antenna," Journal of Vacuum Science & Technology A, vol. 24, 2006, pp. 1421-1424.

Min, K.S., et al., "Atomic layer etching of BeO using $BCl_3$/Ar for the interface passivation layer of III-V MOS devices," Microelectronic Engineering, vol. 114, 2014, pp. 121-125.

Min, K.S., et al., "Atomic layer etching of $Al_2O_3$ using $BCl_3$/Ar for the interface passivation layer of III-V MOS devices," Microelectronic Engineering, vol. 110, pp. 457-460, 2013.

Lim, W.S., et al., "Atomic layer etching of graphene for full graphene device fabrication," Carbon, vol. 50, 2012, pp. 429-435.

* cited by examiner

METHOD OF FABRICATING A SEMICONDUCTOR DEVICE

CROSS-REFERENCE TO RELATED APPLICATIONS

This U.S. non-provisional patent application claims priority under 35 U.S.C. § 119 to Korean Patent Application No. 10-2015-0156937, filed on Nov. 9, 2015, in the Korean Intellectual Property Office, the entire contents of which are hereby incorporated by reference.

BACKGROUND OF THE INVENTION

Example embodiments relate to a method of fabricating a semiconductor device, and in particular, to a method of fabricating a fin field effect transistor.

Due to their small-sized, multifunctional, and/or low-cost characteristics, semiconductor devices are gaining importance in the electronic industry. The semiconductor devices may be classified into a memory device for storing data, a logic device for processing data, and a hybrid device including both memory and logic elements. To meet the increased demand for electronic devices with fast speed and/or low power consumption, it may be advantageous to realize semiconductor devices with high reliability, high performance, and/or multiple functions. To satisfy these technical requirements, complexity and/or integration density of semiconductor devices are being improved.

SUMMARY

Some example embodiments of the inventive concepts provide a method for substantially preventing an upper portion of a fin structure from being excessively etched when a device isolation layer is etched.

Some example embodiments of the inventive concepts provide a method of etching a device isolation layer with a large process window.

Some example embodiments of the inventive concepts provide a method capable of reducing a spatial variation in height of fin structures when the fin structures are formed on a wafer.

According to some example embodiments of the inventive concepts, a method of fabricating a semiconductor device may include forming trenches in a substrate to define a fin structure extending in a direction, forming a device isolation layer to fill the trenches, and removing an upper portion of the device isolation layer to expose an upper side surface of the fin structure. The exposing of the upper side surface of the fin structure may include repeatedly performing an etching cycle including a first step and a second step, and an etching rate of the device isolation layer to the fin structure may be higher in the second step than in the first step.

In some example embodiments, the first step may be performed to form a first surface polymer on a top surface of the fin structure, the second step may be performed to form a second surface polymer on the top surface of the fin structure, and the second surface polymer may be thinner than the first surface polymer.

In some example embodiments, the first and second surface polymers may be a CF-based polymer.

In some example embodiments, an etch rate of the device isolation layer may be higher in the second step than in the first step. The first and second steps may be performed in the same process chamber.

In some example embodiments, the process chamber may include a susceptor configured to load the substrate and an RF source connected to the susceptor, and the RF source may be configured to generate a pulsed RF bias power. A duty ratio of the RF bias power may be higher in the second step than in the first step. For example, the duty ratio in the second step may be about 1.1 to 1.7 times the duty ratio in the first step. The duty ratio in the first step may range from about 60 to about 80% and the duty ratio in the second step ranges from about 80 to about 100%.

In some example embodiments, the first step may be performed at a pressure that is higher than the pressure for the second step. For example, the second step may be performed at a pressure of about 7-14 mTorr, and the first step may be performed at a pressure of about 14-21 mTorr.

In some example embodiments, the first step may be performed using a first etchant, the second step may be performed using a second etchant, and a ratio of carbon to fluorine (C/F ratio) may be higher in the first etchant than in the second etchant. For example, the C/F ratio of the first etchant may be higher than 1/2, and the C/F ratio of the second etchant may be lower than or equal to 1/2. As an example, the first etchant may be $C_4F_6$ and the second etchant may be at least one of $C_4F_8$, $C_2F_6$, or $CF_4$.

In some example embodiments, the first and second steps may be performed in an etching system using a surface wave plasma (SWP) source. The etching system may include a first source supplying part provided to a process chamber, and a second source supplying part provided along a side surface of the process chamber. For example, the second source supplying part may have a ring-shaped structure. Furthermore, the etching system may include a radial line slot antenna (RLSA) provided to an upper portion thereof.

According to some example embodiments of the inventive concepts, a method of fabricating a semiconductor device may include forming trenches in a substrate to define a fin structure extending in a direction, forming a device isolation layer to fill the trenches, and removing an upper portion of the device isolation layer to expose an upper side surface of the fin structure. The exposing of the upper side surface of the fin structure may include repeatedly performing an etching cycle including a first step and a second step, the first and second steps may be performed to form first and second surface polymers, respectively, on a top surface of the fin structure, and the second surface polymer may be thinner than the first surface polymer.

In some example embodiments, the first and second steps may be performed in the same process chamber. The process chamber may include a susceptor configured to load the substrate, and an RF source connected to the susceptor and the RF source may be configured to generate a pulsed RF bias power. For example, a duty ratio of the RF bias power may be higher in the second step than in the first step. For example, the duty ratio in the second step may be about 1.1 to 1.7 times that in the first step.

Example embodiments relate to a method including forming at least one trench in a substrate to define a fin structure, filling the at least one trench with a device isolation layer, and cyclically performing adsorption and desorption on the fin structure, the adsorption including etching the fin structure at a first etch rate, the desorption including etching the fin structure at a second etch rate.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
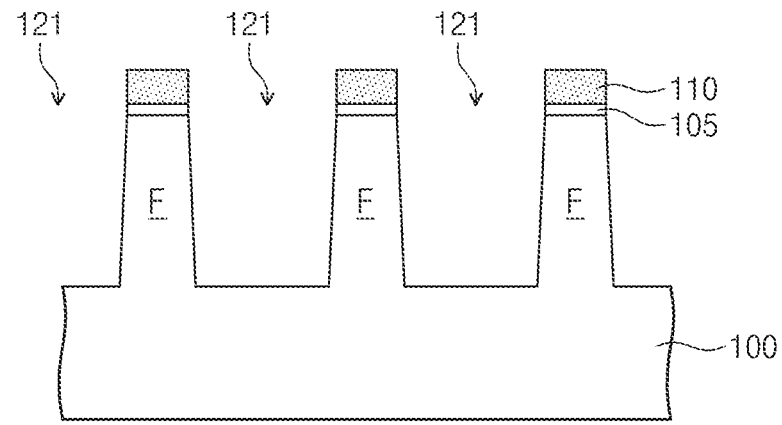
FIGS. 1 through 3 are sectional views illustrating a method of forming fin structures according to some example embodiments of the inventive concepts.

It should be noted that these figures are intended to illustrate the general characteristics of methods, structure and/or materials utilized in example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

The inventive concepts will now be described more fully hereinafter with reference to the accompanying drawings, in which example embodiments of the inventive concepts are shown. The inventive concepts and methods of achieving them will be apparent from the following example embodiments that will be described in more detail with reference to the accompanying drawings. The example embodiments of the inventive concepts may, however, be embodied in different forms and should not be constructed as limited to the embodiments set forth herein. Rather, these example embodiments are provided so that this disclosure will be thorough and complete, and will fully convey the scope of the inventive concepts to those skilled in the art.

As used herein, the singular terms "a," "an" and "the" are intended to include the plural forms as well, unless the context clearly indicates otherwise. It will be understood that when an element is referred to as being "connected" or "coupled" to another element, it may be directly connected or coupled to the other element or intervening elements may be present.

It will be understood that when an element is referred to as being "on," "connected" or "coupled" to another element, it can be directly on, connected or coupled to the other element or intervening elements that may be present. In contrast, when an element is referred to as being "directly on," "directly connected" or "directly coupled" to another element, there are no intervening elements present. As used herein the term "and/or" includes any and all combinations of one or more of the associated listed items. Further, it will be understood that when a layer is referred to as being "under" another layer, it can be directly under or one or more intervening layers may also be present. In addition, it will also be understood that when a layer is referred to as being "between" two layers, it can be the only layer between the two layers, or one or more intervening layers may also be present.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

In the drawing figures, the dimensions of layers and regions may be exaggerated for clarity of illustration. Like reference numerals refer to like elements throughout. The same reference numbers indicate the same components throughout the specification.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein. As used herein, expressions such as "at least one of," when preceding a list of elements, modify the entire list of elements and do not modify the individual elements of the list.

When the terms "about" or "substantially" are used in this specification in connection with a numerical value, it is intended that the associated numerical value include a tolerance of ±10% around the stated numerical value. Moreover, when reference is made to percentages in this specification, it is intended that those percentages are based on weight, i.e., weight percentages. The expression "up to" includes amounts of zero to the expressed upper limit and all values therebetween. When ranges are specified, the range includes all values therebetween such as increments of 0.1%. Moreover, when the words "generally" and "substantially" are used in connection with geometric shapes, it is intended that precision of the geometric shape is not required but that latitude for the shape is within the scope of the disclosure. Although the tubular elements of the embodiments may be cylindrical, other tubular cross-sectional forms are contemplated, such as square, rectangular, oval, triangular and others.

Additionally, the embodiment in the detailed description will be described with sectional views as ideal example views of the inventive concepts. Accordingly, shapes of the example views may be modified according to manufacturing techniques and/or allowable errors. Therefore, the embodiments of the inventive concepts are not limited to the specific shape illustrated in the example views, but may include other shapes that may be created according to manufacturing processes.

Example embodiments of the inventive concepts explained and illustrated herein include their complementary counterparts. The same reference numerals or the same reference designators denote the same elements throughout the specification.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Figure 2:
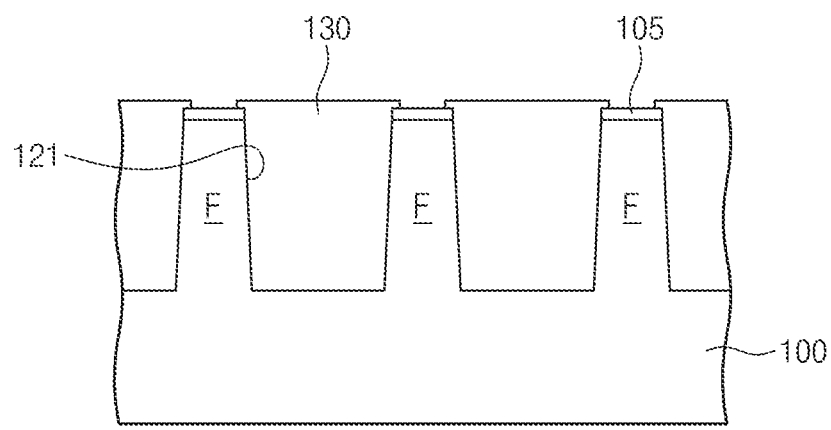
Figure 3:
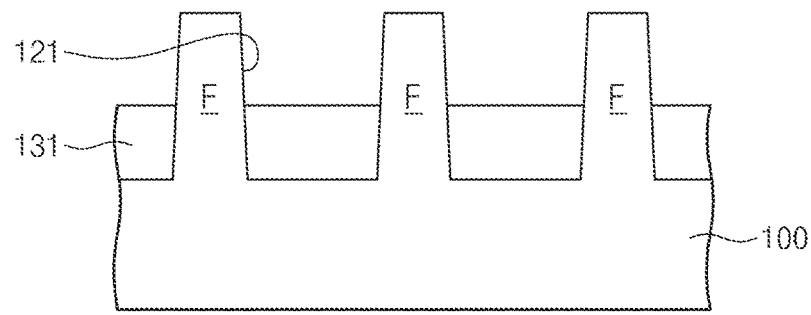

FIGS. 1 through 3 are sectional views illustrating a method of forming fin structures according to some example embodiments of the inventive concepts.

Referring to FIG. 1, a substrate 100 may be patterned to form fin structures F. The substrate 100 may be a semiconductor substrate (e.g., of silicon, germanium, or silicon-germanium) or a compound semiconductor substrate. The substrate 100 may include a plurality of semiconductor layers, at least one of which is different from others in terms of material. The fin structures F may extend along a top surface of the substrate 100, and when viewed in a plan view, each or at least one of the fin structures F may be shaped like a line or a bar. The shape of the fin structures F may not be limited thereto and may be variously changed depending on the type of a semiconductor device. The fin structures F may be doped to have a first conductivity type. In certain example embodiments, the fin structures F may be formed of or include an intrinsic semiconductor material.

The formation of the fin structures F may include etching a top portion of the substrate 100 to form trenches 121 defining side surfaces of the fin structures F. The trenches 121 may be formed to have a depth which is greater than a width of the fin structures F. For example, the trenches 121 may have a depth ranging from about 10 nm to about 50 nm. The width of the trenches 121 (i.e., a distance between the fin structures F) may be determined depending on type of semiconductor device including the fin structures F.

The formation of the trenches 121 may include forming mask patterns 110 on the substrate 100 and anisotropically etching the substrate 100 using the mask patterns 110 as an etch mask. In some example embodiments, each or at least one of the mask patterns 110 may include a plurality of layers, which are stacked, for example sequentially stacked on the substrate 100 and have an etch selectivity with respect to each other. Before the formation of the mask patterns 110, a buffer layer 105 may be provided on the substrate 100. As an example, the buffer layer 105 may include a silicon oxide layer or a silicon oxynitride layer. The mask patterns 110 may be removed after the formation of the trenches 121.

Referring to FIG. 2, a device isolation layer 130 may be formed to fill the trenches 121. The device isolation layer 130 may be formed to expose a top surface of the buffer layer 105. The device isolation layer 130 may include a silicon oxide layer. As an example, the device isolation layer 130 may be formed of or include at least one of a high density plasma (HDP) oxide, TEOS (TetraEthylOrthoSilicate), plasma-enhanced TEOS (PE-TEOS), O3-TEOS, undoped silicate glass (USG), phosphosilicate glass (PSG), borosilicate glass (BSG), borophosphosilicate glass (BPSG), fluoride silicate glass (FSG), or spin on glass (SOG). The device isolation layer 130 may be formed to have a top surface which is higher than the top surface of the buffer layer 105, but the inventive concepts may not be limited thereto. The formation of the device isolation layer 130 may include a planarization process.

Referring to FIG. 3, an upper portion of the device isolation layer 130 may be removed to form device isolation patterns 131 exposing upper portions of the fin structures F. The buffer layer 105 may be removed during the removal of the upper portion of the device isolation layer 130. In some example embodiments, the removal of the upper portion of the device isolation layer 130 may include a dry etching process. The dry etching process may be performed to selectively etch the device isolation layer 130.

Figure 4:
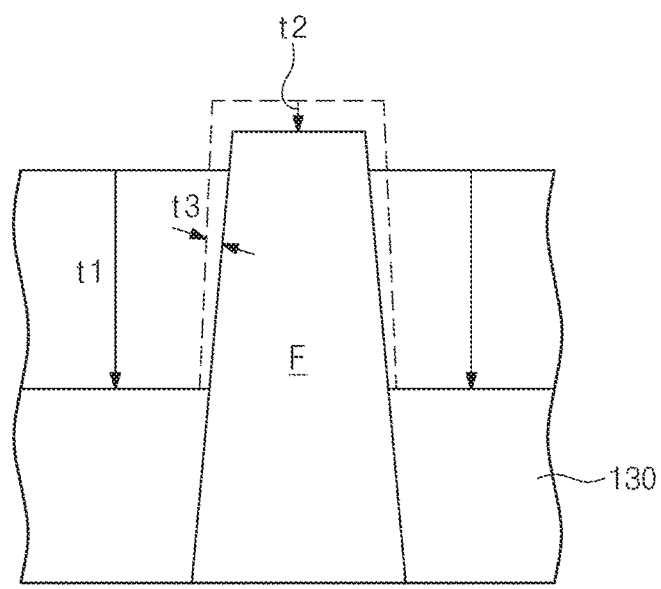
FIG. 4 is a sectional diagram schematically illustrating a partial etching of an upper portion of a fin structure, which may occur when an upper portion of a device isolation layer is removed.

FIG. 4 is a sectional diagram schematically illustrating a partial etching of an upper portion of the fin structure F, which may occur when an upper portion of the device isolation layer 130 is removed. When an etching process is performed to remove the upper portion of the device isolation layer 130, the exposed upper portions of the fin structures F may be exposed to an etchant for the etching process. This may lead to a change the initial shape of the fin structure F before etching of the upper portion of the device isolation layer 130 (for example, a decrease in the top width of the fin structure F). For example, as the etching of the device isolation layer 130 progresses, an area of the fin structure F exposed to the etchant may be gradually increased from the top surface of the fin structure F, as shown in FIG. 4. In some example embodiments, when the device isolation layer 130 is etched by a first thickness t1, the top and side surfaces of the fin structures F may be recessed by second and third thicknesses t2 and t3, respectively.

A ratio of the second thickness t2 and/or the third thickness t3 to the first thickness t1 may be dependent on an etch selectivity property of the etchant. An increase of the second and third thicknesses t2 and t3 (i.e., an increase in the etching amount of the fin structure F) may lead to an increased difference in the top width between initial and final shapes of the fin structure F; for example, at the final stage of the etching process, the fin structure F may have a top width that is considerably smaller than an initial top width thereof. Since the upper portion of the fin structure F is used as a channel region of a transistor, the reduction in the top width of the fin structure F may result in a reduction in width of the channel region, and this may cause deterioration in electric characteristics of the transistor (e.g., a reduction in mobility of electric charges or an undesirable increase in threshold voltage of the transistor).

Figure 5:
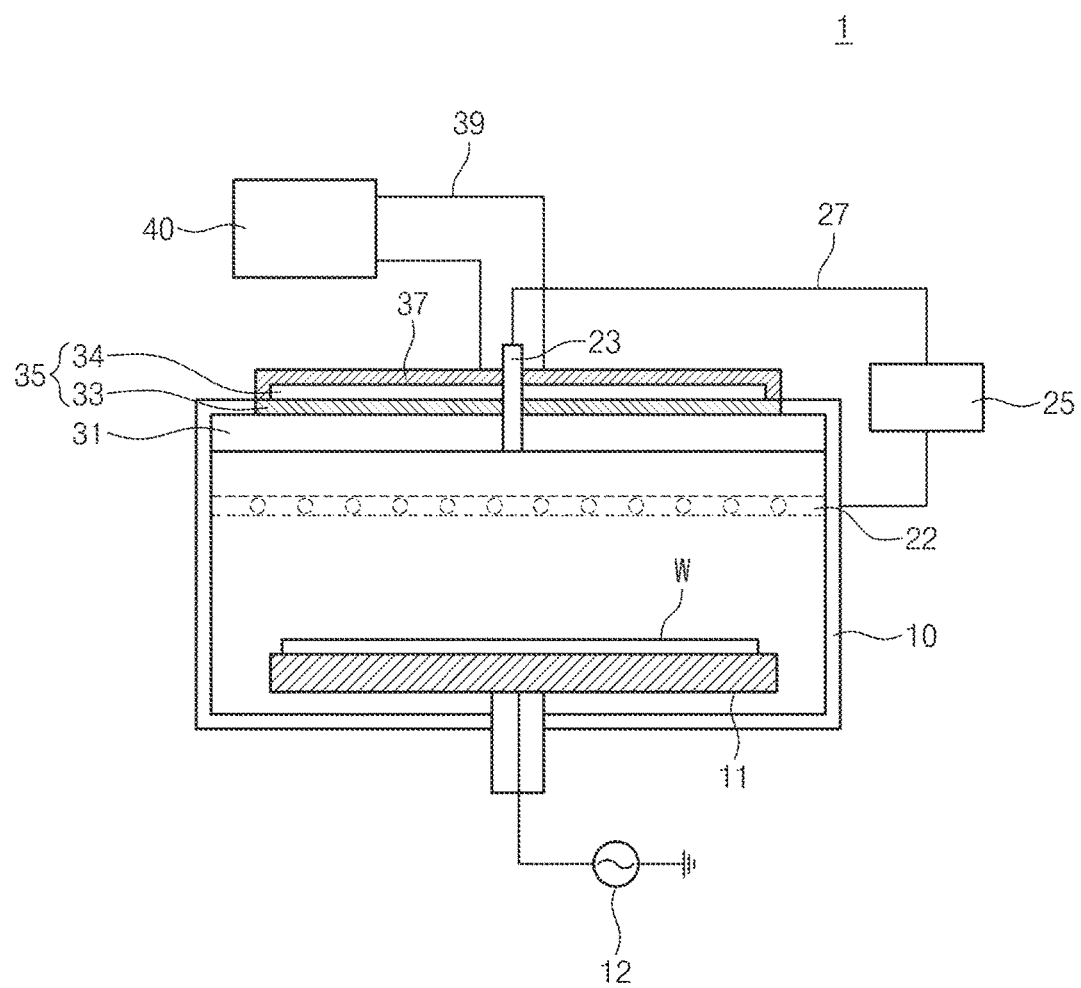
FIG. 5 is a diagram illustrating an example of an etching system that is configured to perform an etching process on a device isolation layer.

FIG. 5 is a diagram illustrating an example of an etching system according to some example embodiments of the inventive concepts, and the etching system of FIG. 5 may be used to perform an etching process on a device isolation layer. According to some example embodiments of the inventive concepts, the etching process on the device isolation layer may be performed using an etching system 1 with a process chamber 10. The etching system 1 may be configured to perform the etching process using high density plasma. For example, the etching system 1 may be a surface wave plasma (SWP) system provided with a radial line slot antenna (RLSA) 35.

The etching system 1 may include a susceptor 11, which is provided at a lower portion thereof and is configured to load a wafer W. The susceptor 11 may be connected to a radio frequency (RF) source 12. The RF source 12 may be configured to apply a RF bias of about, for example, 13.56 MHz to the susceptor 11. The susceptor 11 may be configured to hold the wafer W using a DC power or in an electrostatic manner. The susceptor 11 may be connected to a heater.

The chamber 10 may be connected to a gas supply source 25, in which a process gas is stored. In some example embodiments, the process gas may contain a plasma excitation gas and an etching gas. The plasma excitation gas may include at least one of Ar, He, Ne, Kr, or Xe. The etching gas may include at least one of a plurality of CF-based etchants (e.g., $C_4F_6$ or $C_4F_8$). The etching gas may contain an oxidative gas. The oxidative gas may include at least one of $O_2$, $CO_2$, or CO.

The gas supply source 25 may include a first gas supplying part 23, which is disposed at an upper portion of the chamber 10, and a ring-shaped second gas supplying part 22, which is provided along an inner side surface of the chamber 10. The second gas supplying part 22 may have a plurality of openings or nozzles, which are configured to supply the process gas in an inward direction from a side surface to a center of the chamber 10.

The etching system 1 may include an RLSA 35, which is provided on the chamber 10 and is configured to generate a microwave plasma. The RLSA 35 may be connected to a microwave generator 40 through a wave guide 39. Accordingly, a microwave power generated by the microwave generator 40 may be transmitted to the RLSA 35 through the wave guide 39. In some example embodiments, the microwave generator 40 may be configured to generate a microwave power of about 2.45 GHz. The RF power source for generating the microwave power may be operated with a power ranging from about 1000 W to about 3000 W. The RLSA 35 may include a slot plate 33, which is formed of or include a conductive material (e.g., copper or aluminum), and a dielectric plate 34 on the slot plate 33. The slot plate 33 may have slits shaped like a letter 'T'. The slits may be disposed to form a concentrically circular arrangement. The RLSA 35 may be configured to propagate the microwave power in a radial direction of the RLSA 35, and the microwave power may be propagated in the chamber 10 through the slits of the slot plate 33. The microwave power may be used to ionize the process gas present below the RLSA 35 and thereby to generate a plasma in the chamber 10.

The dielectric plate 34 may be configured to allow the microwave power, which is transmitted to the RLSA 35 through the wave guide 39, to be propagated in a radial direction of the dielectric plate 34 and to have a shortened wavelength. As an example, the dielectric plate 34 may be formed of or include at least one of quartz, ceramics, or alumina. Top and bottom surfaces of the dielectric plate 34 may be covered with a conductive material. A cooling plate 37 may be provided on the dielectric plate 34. The cooling plate 37 may be configured to exhaust heat energy generated in the RLSA 35 to the outside of the chamber 10. As an example, the cooling plate 37 may be formed of or include a thermally conductive material (e.g., copper or aluminum).

A dielectric window 31 may be provided below the RLSA 35. The dielectric window 31 may be configured to substantially hermetically seal an internal space of the chamber 10. The dielectric window 31 may be formed of or include a material, allowing the microwave power to pass therethrough. As an example, the dielectric window 31 may be formed of or include at least one of quartz, ceramics, or alumina.

In the etching system 1, the microwave power may be used to generate a high density plasma with a low electron temperature in a region for an etching process. This may make it possible to reduce ion bombarding damage which may occur on the wafer W when the etching process is performed. In addition, since the process gas is supplied onto the wafer W through the ring-shaped second gas supplying part 22 provided below the dielectric window 31, it is possible to control dissociation of the process gas.

Figure 6:
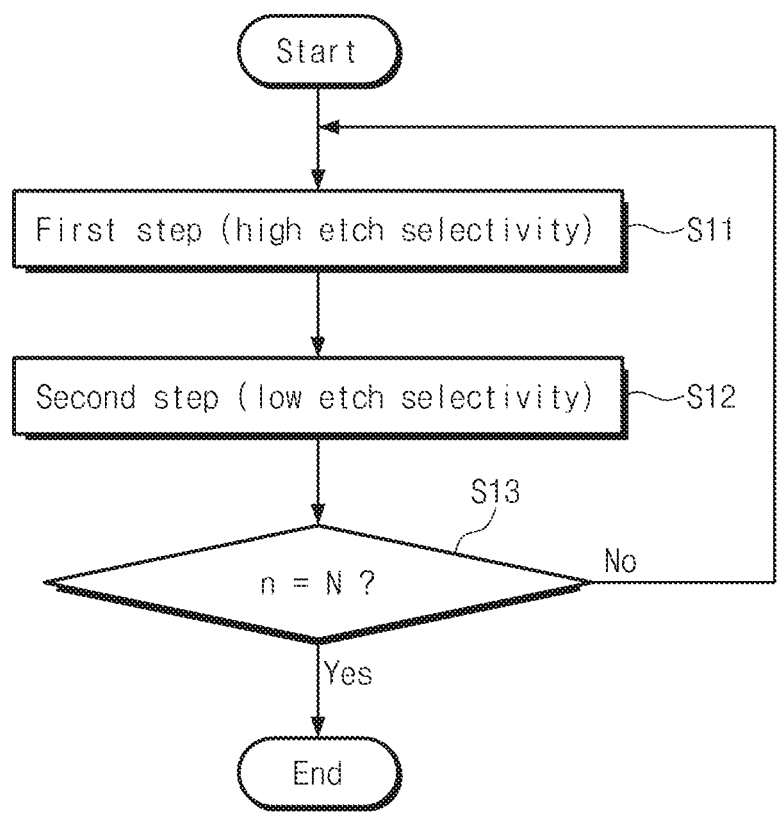
FIG. 6 is a flow chart illustrating a process of etching a device isolation layer, according to some example embodiments of the inventive concepts.

FIG. 6 is a flow chart illustrating a process of etching a device isolation layer, according to some example embodiments of the inventive concepts.

Referring to FIGS. 5 and 6, a process of etching a device isolation layer according to some example embodiments of the inventive concepts may be performed in the etching system 1. The etching process may include a first step S11, allowing the device isolation layer to be etched at a relatively high etch rate compared with the etch rate of the fin structures, and a second step S12, allowing the device isolation layer to be etched at an etch rate lower than the etch rate discussed in the first step S11. The first step S11 and the second step S12 may be performed in the same process chamber. The first and second steps S11 and S12 may be performed in a cyclic manner; for example, the first and second steps S11 and S12 may be repeated at least two times during the etching process. In some example embodiments, in the case where the iteration number "n" of each of, or at least one of the first and second steps S11 and S12 reaches a desired, or alternatively predetermined value "N," the etching process may be terminated (in S13).

The first step S11 may be performed under a more polymeric condition, compared with the condition under which the second step S12 is performed. In other words, the second step S12 may be performed under a less polymeric condition, compared with the condition for the first step S11. The expression 'more polymeric condition' will be used herein to refer to an etching condition, allowing a polymer layer (hereinafter, a surface polymers, which is formed on a surface of an etching target by a chemical reaction between the etching target and the etchant, to have a relatively large thickness, and the expression 'less polymeric condition' will be used to refer to an etching condition, allowing the surface polymer to have a relatively small thickness. As an example, in the case where a CF-based gas is used as the etchant, the surface polymer may be a CF-based polymer layer, which may be formed by a chemical reaction between the fin structure and/or device isolation layer and the etchant. The first step S11 may be referred to as an adsorption step of forming the surface polymer with a relatively low difficulty, and the second step S12 may be referred to as a desorption step of forming the surface polymer with a relatively high difficulty.

During the etching process, some of polymeric molecules constituting the surface polymer may be deposited on the surface of the etching target, and other molecules constituting the surface polymer may be removed from the surface of the etching target. Deposition and removal of the polymeric molecules may occur continuously and simultaneously or contemporaneously during the etching process. Accordingly, a thickness of the surface polymer in the etching process may be determined by a ratio of a deposition rate to a removal rate. In the case where the more polymeric condition is used, a relatively thick surface polymer may be formed on a surface of the etching target during the etching process. In other words, the etching target may be passivated with the relatively thick surface polymer, and thus, the etching target may be etched at a relatively small etching rate.

In the case where the less polymeric condition is used, a relatively thin surface polymer may be formed on the surface of the etching target. Accordingly, it is possible to more quickly remove the relatively thin surface polymer from the etching target and consequently to etch the etching target at a relatively high etch rate.

According to some example embodiments of the inventive concepts, the first step S11 and the second step S12 may be realized in various manners. For example, the first step S11 and the second step S12 may be realized using a difference in duty ratio of RF bias. Hereinafter, a difference in the duty ratio of the RF bias between the first and second steps S11 and S12 will be described in more detail.

Figure 7:
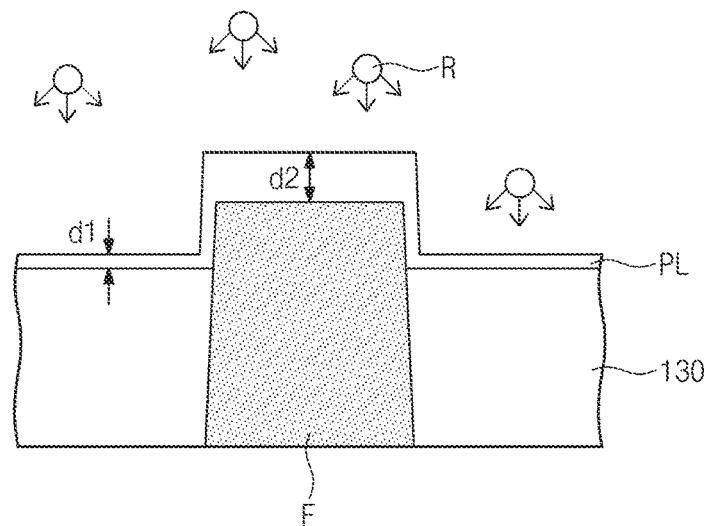
FIG. 7 is a conceptual diagram illustrating a first step according to example embodiments of the inventive concepts.
Figure 8:
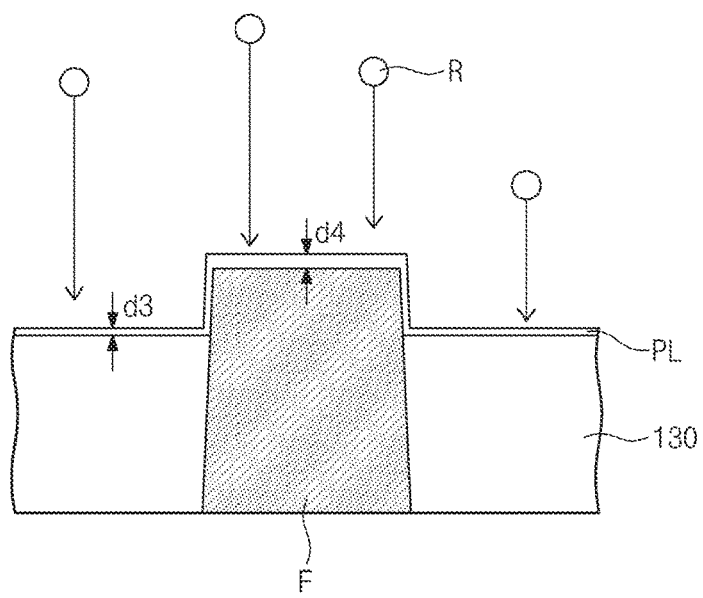
FIG. 8 is a conceptual diagram illustrating a second step according to example embodiments of the inventive concepts.

FIG. 7 is a conceptual diagram illustrating the first step S11 according to example embodiments of the inventive concepts, and FIG. 8 is a conceptual diagram illustrating the second step S12 according to example embodiments of the inventive concepts. In the chamber 10 of FIG. 5, the upper portion of the fin structure F and the upper portion of the device isolation layer 130 may be exposed to activated ions R. Some of the activated ions R may be reacted with atoms of the fin structure F and the device isolation layer 130 to form a surface polymer PL on the fin structure F and the device isolation layer 130. In the case where the fin structure F contains silicon and the device isolation layer 130 contains oxide, some of the activated ions R may be reacted with oxygen atoms of the device isolation layer 130 to produce a material containing CO and/or $CO_2$. The gaseous material of CO and/or $CO_2$ may be more easily removed from the surface of the device isolation layer 130 (i.e., the etching target), compared with removing the activated ions reacted with the fin structure F. As a result, an etching rate of the device isolation layer 130 may be higher than the etching rate of the fin structure F.

Referring to FIG. 7, in the case where a duty ratio of the RF bias is lower in the first step S11 than in the second step S12, the straightness in a propagation path of the activated ions R may be low in a direction toward a wafer provided with the fin structure F and the device isolation layer 130. In some example embodiments, the duty ratio in the first step S11 may range from about 60% to about 80%. The activated ions R may include many positive ions having low energy and large angular distribution. As described above, a material produced from the activated ions R may be more easily removed from a surface of the device isolation layer 130 containing oxygen atoms, and thus, the surface polymer PL on the device isolation layer 130 may have a relatively small thickness (hereinafter, a first thickness d1) during the etching process. By contrast, owing to the relatively low duty ratio of the RF bias, the surface polymer PL on the fin structure F to have a relatively large thickness (hereinafter, a second thickness d2). Accordingly, the device isolation layer 130 may be etched at an etch rate, which is higher than the etch rate of the fin structure F, on which the relatively thick surface polymer PL is formed. That is, in the first step S11, the device isolation layer 130 may be etched at an etch rate that is higher than the etch rate of the fin structure F.

Referring to FIG. 8, the duty ratio of the RF bias may be higher in the second step S12 than in the first step S11. As an example, the duty ratio in the second step S12 may be about 1.1 to about 1.7 times that in the first step S11. In some example embodiments, the duty ratio in the second step S12 may range from about 80% to about 100%. In the second step S12, due to the high duty ratio, the straightness in a propagation path of the activated ions R may be high in the direction toward the wafer provided with the fin structure F and the device isolation layer 130. For example, the activated ions R may include many positive ions having high energy and small angular distribution. Due to the high duty ratio of the RF bias, the surface polymer PL to be formed on the fin structure F may have a fourth thickness d4 that is smaller than the second thickness d2 in the first step S11. In the second step S12, the surface polymer PL provided on the device isolation layer 130 may have a third thickness d3 which is smaller than the fourth thickness d4. As an example, the fourth thickness d4 may be smaller by about 10-30% than the third thickness d3. The third thickness d3 may be smaller than the first thickness d1.

The fourth thickness d4 may be greater than the third thickness d3, and a difference between the third and fourth thicknesses d3 and d4 may be smaller than a difference between the first and second thicknesses d1 and d2 The thicknesses d3 and d4 of the surface polymer PL to be formed in the second step S12 may be too small to substantially prevent the device isolation layer 130 and the fin structure F from being etched. As a result, a ratio of an etching rate of the device isolation layer 130 to the etching rate of the fin structure F in the second step S12 may be lower than the ratio in the first step S11. Since the duty ratio of the RF bias in the second step S12 is relatively high compared with the duty ratio of the RF bias in the first step S11, the etching rate of the device isolation layer 130 in the second step S12 may be higher than the etching rate in the first step S11.

In some example embodiments, the first step S11 and the second step S12 may be repeated several times. The first step S11 may be performed to realize high etch selectivity and a slow etching rate of the device isolation layer 130, whereas the second step S12 may be performed to realize low etch selectivity and a fast etching rate of the device isolation layer 130. According to some example embodiments of the inventive concepts, since two steps of different process conditions are repeated during the etching process, it is possible to realize a large process window, compared with a non-cyclic etching process. In addition, it is possible to improve the etch selectivity in the etching process, without a reduction in the etching rate of the device isolation layer 130, and thus, it is possible to substantially prevent the fin structure F serving as a channel region of a transistor from being excessively recessed. This may increase a ratio of a top width to a bottom width of each or at least one fin structure F (i.e., a top/bottom CD ratio).

In some example embodiments, there may be a difference in other process condition, not in the duty ratio, between the first step S11 and the second step S12. For example, the first step S11 may be performed at a relatively high chamber pressure, whereas the second step S12 may be performed at a relatively low chamber pressure. As an example, the chamber pressure in the first step S11 may range from about 14 mTorr to about 21 mTorr, and the chamber pressure in the second step S12 may range from about 7 mTorr to about 14 mTorr.

The first step S11 may be performed using a first etchant, where a ratio of carbon to fluorine (hereinafter, C/F ratio) is high, and the second step S12 may be performed using a second etchant having a low C/F ratio. As an example, the C/F ratio of the first etchant may be greater than 1/2, and the C/F ratio of the second etchant may be smaller than or equal to 1/2. As an example, the first etchant may be $C_4F_6$ (C/F ratio=1/1.5), and the second etchant may be at least one of $C_4F_8$ (C/F ratio=1/2), C2F6 (C/F ratio=1/3), or CF4 (C/F ratio=1/4).

In some example embodiments, the second step S12 may be performed with relatively low RF bias and/or relatively low RF power, compared with the RF bias and the RF power for the first step S11. As an example, the RF source power of the first step S11 may range from about 1000 W to about 2000 W, and the RF source power of the second step S12 may range from about 2000 W to about 3000 W. For example, the RF bias power of the first step S11 may range from about 0 W to about 500 W, and the bias power of the second step S12 may range from about 500 W to about 1000 W.

Figure 9:
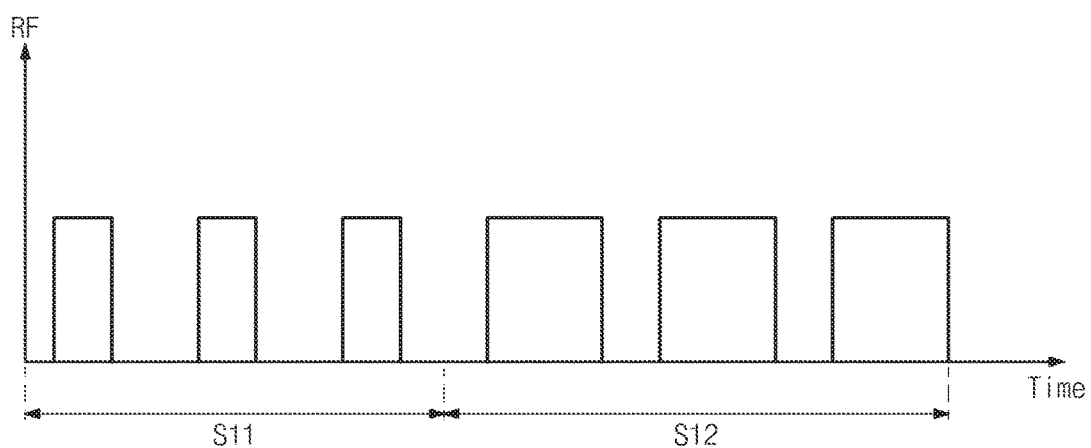
FIGS. 9 and 10 are graphs exemplarily showing RF bias and duty ratio conditions in the first and second steps according to some example embodiments of the inventive concepts.
Figure 10:
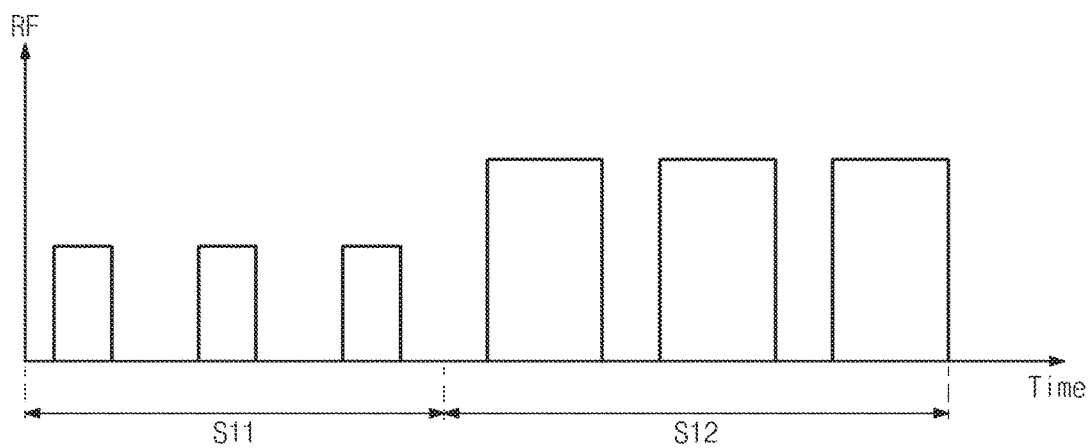

FIGS. 9 and 10 are graphs illustrating RF bias and duty ratio conditions in the first and second steps S11 and S12 according to some example embodiments of the inventive concepts.

Referring to FIG. 9, the first step S11 may be performed in a first condition, in which a duty ratio of the RF bias is relatively low, whereas the second step S12 may be performed in a second condition, in which a duty ratio of the RF bias is relatively high. In the graph of FIGS. 9 and 10, the x axis represents a process time and a y axis represents an RF bias and/or an RF power. The first and second steps S11 and S12 may be repeated a plurality of times. Accordingly, the first step S11 may be performed in the more polymeric condition, and the second step S12 may be performed in the less polymeric condition. In some example embodiments, the first and second steps S11 and S12 may be performed in substantially the same condition in terms of the RF bias and/or the RF bias power.

Referring to FIG. 10, the second step S12 may be performed with an RF bias and/or an RF bias power that is greater than the RF bias and/or the RF bias power for the first step S11. The duty ratio of the second step S12 may be greater than the duty ratio of the first step S11, but in certain embodiments, the duty ratio of the second step S12 may be substantially equal to the duty ratio of the first step S11.

Figure 11:
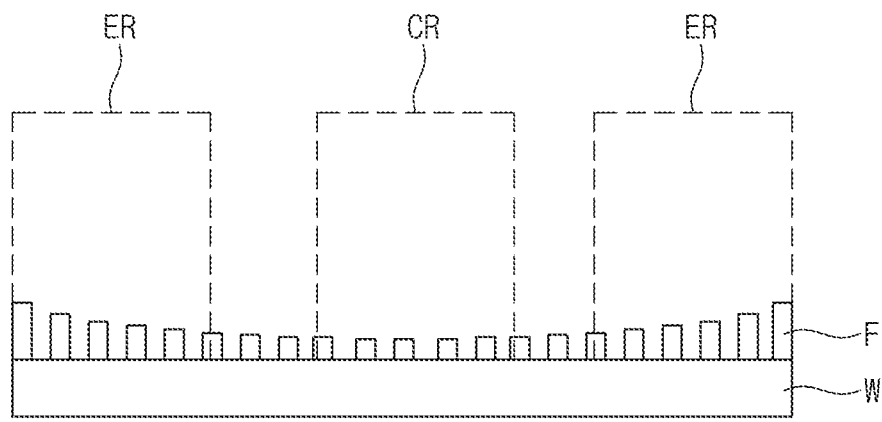
FIG. 11 is a schematic diagram illustrating a positional variation in height of fin structures, which is formed on a wafer by the first step according to example embodiments of the inventive concepts.
Figure 12:
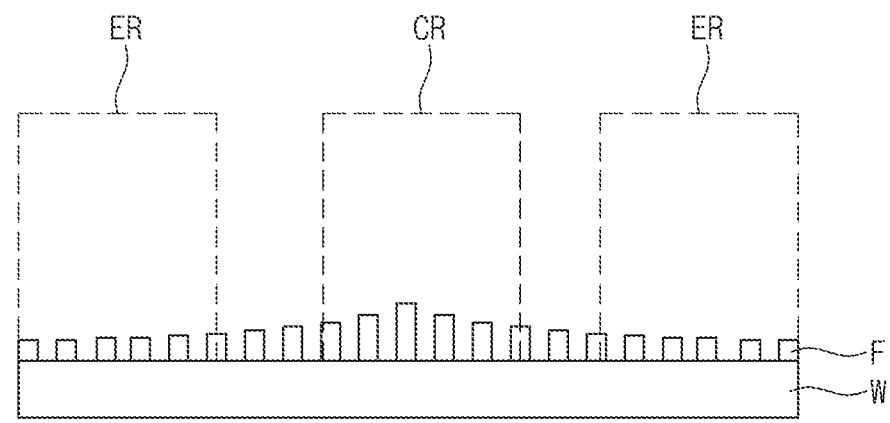
FIG. 12 is a schematic diagram illustrating a positional variation in height of fin structures, which is formed on a wafer by the second step according to example embodiments of the inventive concepts.

FIG. 11 is a schematic diagram illustrating a positional variation in height of the fin structures F, which are formed on the wafer W by the first step S11 according to example embodiments of the inventive concepts. FIG. 12 is a schematic diagram illustrating a positional variation in height of the fin structures F, which are formed on the wafer W by the second step S12 according to example embodiments of the inventive concepts. The wafer W may include an edge region ER adjacent to an inner sidewall of a chamber and a center region CR distant from the inner sidewall of the chamber. In the first step S11, heights of the fin structures F may be small on the center region CR and large on the edge region ER. The heights of the fin structures F may gradually decrease in a direction from the edge region ER toward the center region CR. By contrast, in the second step S12, the heights of the fin structures F may be large on the center region CR and small on the edge region ER. The heights of the fin structures F may gradually increase in the direction from the edge region ER toward the center region CR.

According to some example embodiments of the inventive concepts, the first and second steps S11 and S12 may be performed in the etching system 1 described with reference to FIG. 5. As described above, the etching system 1 may include the ring-shaped second gas supplying part 22, which is provided along an inner side surface of the chamber 10. In the first step S11, due to the relatively low duty ratio, it typically takes a long time for the process gas supplied from the second gas supplying part 22 to be diffused from the edge region ER to the center region CR; that is, a diffusion in the first step S11 may be high. As a result, the etching process may be dominant on the center region CR. By contrast, in the second step S12, due to the relatively high duty ratio, it takes a short time for the process gas supplied from the second gas supplying part 22 to be diffused to the center region CR; that is, a diffusion in the second step S12 may be low. As a result, the etching process may be dominant on the edge region ER.

According to some example embodiments of the inventive concepts, the first and second steps S11 and S12 may be repeated several times during the etching process. In this case, since a positional difference of the etching rate is summed during the repetition of the first and second steps S11 and S12, it is possible to reduce a spatial variation in height of the tin structures on the edge region ER and the center region CR.

Figure 13:
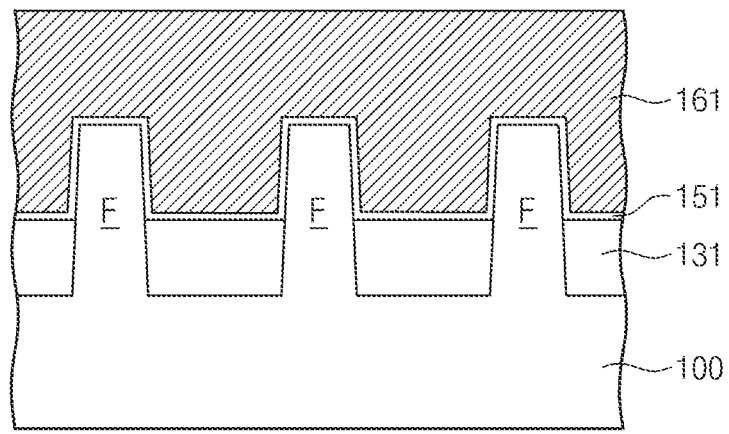
FIG. 13 is a sectional view illustrating a transistor, in which a fin structure according to example embodiments of the inventive concepts is provided.

FIG. 13 is a sectional view illustrating a transistor, in which the tin structure F according to some example embodiments of the inventive concepts is provided. A gate insulating layer 151 and a gate electrode 161 may be formed, for example sequentially formed on the fin structure F. Although not illustrated, source/drain regions may be formed at both end portions of the fin structure F. The upper portion of the fin structure F exposed by the device isolation pattern 131 may be used as a channel region of a transistor. The transistor may be a part of a logic device or a memory device (e.g., SRAM). Although a single gate electrode is illustrated to cross a plurality of the fin structures F disposed adjacent to each other, this configuration may be variously changed depending on a kind of the transistor.

According to some example embodiments of the inventive concepts, it is possible to substantially prevent an upper portion of a fin structure from being excessively etched when a device isolation layer is etched. Furthermore, the etching step of the device isolation layer may be performed with a large process window. In addition, according to some example embodiments of the inventive concepts, it is possible to reduce a spatial variation in height of fin structures to be formed on a wafer.

While example embodiments of the inventive concepts have been particularly shown and described, it will be understood by one of ordinary skill in the art that variations in form and detail may be made therein without departing from the spirit and scope of the attached claims.

What is claimed is:

1. A method of fabricating a semiconductor device, comprising:
   forming trenches in a substrate to define a fin structure extending in a direction;
   forming a device isolation layer to fill the trenches; and
   removing an upper portion of the device isolation layer to expose an upper side surface of the fin structure,
   wherein the exposing of the upper side surface of the fin structure includes repeatedly performing an etching cycle including a first step and a second step,
   an etching rate of the device isolation layer is higher in the second step than in the first step;
   wherein the first step is performed to form a first surface polymer on the upper side surface of the fin structure,
   wherein the second step is performed to form a second surface polymer on the upper side surface of the fin structure, and
   wherein the second surface polymer is thinner than the first surface polymer.

2. The method of claim 1, wherein at least one of the first and second surface polymers is a CF-based polymer.

3. The method of claim 1, wherein an etch rate of the device isolation layer is higher in the second step than in the first step.

4. The method of claim 1, wherein the first and second steps are performed in the same process chamber.

5. The method of claim 4, wherein
   the process chamber comprises a susceptor configured to load the substrate, and an RF source connected to the susceptor, and
   the RF source is configured to generate a pulsed RF bias power.

6. The method of claim 5, wherein a duty ratio of the RF bias power is higher in the second step than in the first step.

7. The method of claim 6, wherein the duty ratio of the RF bias power in the second step is about 1.1 to about 1.7 times the duty ratio of the RF bias power in the first step.

8. The method of claim 6, wherein
   the duty ratio of the RF bias power in the first step ranges from about 60 to about 80%, and
   the duty ratio of the RF bias power in the second step ranges from about 80% to about 100%.

9. The method of claim 1, wherein the first step is performed at a pressure that is higher than the pressure for the second step.

10. The method of claim 9, wherein
    the second step is performed at a pressure of about 7 mTorr to about 14 mTorr, and
    the first step is performed at a pressure of about 14 mTorr to about 21 mTorr.

11. The method of claim 1, wherein
    the first step is performed using a first etchant,
    the second step is performed using a second etchant, and
    a ratio of carbon to fluorine (C/F ratio) is higher in the first etchant than in the second etchant.

12. The method of claim 11, wherein
    the C/F ratio of the first etchant is higher than 1/2, and
    the C/F ratio of the second etchant is lower than or equal to 1/2.

13. The method of claim 11, wherein
    the first etchant is $C_4F_6$, and
    the second etchant is at least one of $C_4F_8$, $C_2F_6$, or $CF_4$.

14. The method of claim 1, wherein the first and second steps are performed in an etching system using a surface wave plasma (SWP) source.

* * * * *